United States Patent
Sato

(10) Patent No.: US 7,944,683 B2
(45) Date of Patent: May 17, 2011

(54) IMAGE DISPLAY APPARATUS

(75) Inventor: Takeshi Sato, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 12/396,788

(22) Filed: Mar. 3, 2009

(65) Prior Publication Data
US 2009/0225507 A1 Sep. 10, 2009

(30) Foreign Application Priority Data

Mar. 5, 2008 (JP) ................................ 2008-054748

(51) Int. Cl.
H05K 7/14 (2006.01)

(52) U.S. Cl. ......... 361/679.21; 361/679.22; 361/679.01; 349/58

(58) Field of Classification Search ............. 361/679.01, 361/679.02, 679.21, 679.22, 679.26, 679.09; 248/917–924; 349/58–60
See application file for complete search history.

(56) References Cited

U.S. PATENT DOCUMENTS

| 6,744,186 B2 | 6/2004 | Oishi et al. ....................... 313/46 |
| 7,072,007 B2 | 7/2006 | Kaneko ............................ 349/58 |
| 2005/0238853 A1* | 10/2005 | Kim et al. ..................... 428/192 |
| 2007/0153458 A1* | 7/2007 | Okimoto et al. .............. 361/681 |

FOREIGN PATENT DOCUMENTS

| JP | 2001-345586 | 12/2001 |
| JP | 2005-24874 | 1/2005 |

* cited by examiner

Primary Examiner — Jayprakash N Gandhi
Assistant Examiner — Ingrid Wright
(74) Attorney, Agent, or Firm — Fitzpatrick, Cella, Harper & Scinto

(57) ABSTRACT

An image display apparatus includes a display panel that displays an image, a support unit that supports a rear surface of the display panel, and an exterior member that covers the support unit. The support unit includes a first plate-like member and a second plate-like member having a concave-convex shape, wherein the first plate-like member is fixed to the display panel at a plurality of first fixing portions with bonding members, convex portions of the second plate-like member are fixed to the first plate-like member at a plurality of second fixing portions, and concave portions of the second plate-like member are fixed to a support member at a plurality of third fixing portions.

8 Claims, 7 Drawing Sheets

IMAGE DISPLAY APPARATUS

BACKGROUND OF THE INVENTION

1. Field of the Invention

This invention relates to an image display apparatus.

2. Description of the Related Art

As a conventional technique for preventing the breakage of the display panel of the image display apparatus due to an external impact, vibration or static handling, a configuration has been proposed in which a support unit is interposed between the display panel and the exterior member. The support unit is desirably configured to have a high rigidity and improve the impact resistance of the display panel.

Japanese Patent Application Laid-Open No. 2001-345586 discloses a lightweight chassis structure of the plasma display apparatus in which a sufficient support strength and a sufficient heat radiation effect can be secured at low cost by coupling a first chassis member to a second chassis member in butted contact with each other.

As disclosed in this Japanese Patent Application Laid-Open No. 2001-345586 which uses two plate-like members, one of the two plate-like members is partly protruded toward the other plate-like member, and a support unit high in rigidity can be realized by coupling the protruded portion to the other plate-like member.

In the case where the display panel and the support unit are bonded to each other over the whole surface of the display panel of the image display apparatus described in Japanese Patent Application Laid-Open No. 2001-345586, however, though free of any problem in static handling, the display panel may be broken under a strong impact, if imposed on the exterior member from an external source. Specifically, a large deformation is locally caused at the joint of the two plate-like members and may be directly transmitted to and break the display panel.

Also, in the case where a large impact is exerted directly from an external source on the display panel of the display apparatus having a support unit formed of two plate-like members, the display panel may be broken. Specifically, the high rigidity of the support unit causes a large impact to be provisionally acted on the display panel from the support unit. This impact may break the display panel.

Japanese Patent Application Laid-Open No. 2005-24874 discloses a configuration in which a PDP and a chassis member are partially bonded using the two-side tape and the one-side tape, so that the bonding area for heat conduction is secured while at the same time improving the resistance of the display panel against an external impact.

SUMMARY OF THE INVENTION

The object of this invention is to provide an image display apparatus including a display panel having an improved impact resistance.

In order to achieve the object described above, a first aspect of an image display apparatus according to the present invention is an image display apparatus comprising:

a display panel that displays an image;

a support unit that supports a rear surface of the display panel; and an exterior member that covers the support unit;

wherein the support unit includes a first plate-like member and a second plate-like member;

wherein the first plate-like member is fixed to the display panel at a first fixing area;

wherein the second plate-like member is fixed to the first plate-like member at a second fixing area and to the exterior member at a third fixing area; and wherein the first fixing area and the second fixing area are arranged not in overlapped relation with each other at least within the third fixing area in a view projected on a surface parallel to a display surface of the display panel.

A second aspect of image display apparatus according to the present invention is an image display apparatus comprising:

a display panel that displays an image; and a support unit that supports a rear surface of the display panel;

wherein the support unit includes a first plate-like member and a second plate-like member;

wherein a plurality of members of different rigidity are interposed between the display panel and the first plate-like member;

wherein the second plate-like member is fixed to the first plate-like member at a fixing area; and wherein the member having the highest rigidity among the plurality of members of different rigidity and the fixing area are arranged not in overlapped relation with each other within a view projected on a surface parallel to a display surface of the display panel.

According to this invention, there is provided an image display apparatus having a display panel of an improved impact resistance.

Further features of the present invention will become apparent from the following description of exemplary embodiments with reference to the attached drawings.

DESCRIPTION OF THE EMBODIMENTS

First Embodiment

The first embodiment of the invention is explained below with reference to the drawings.

Figure 1:
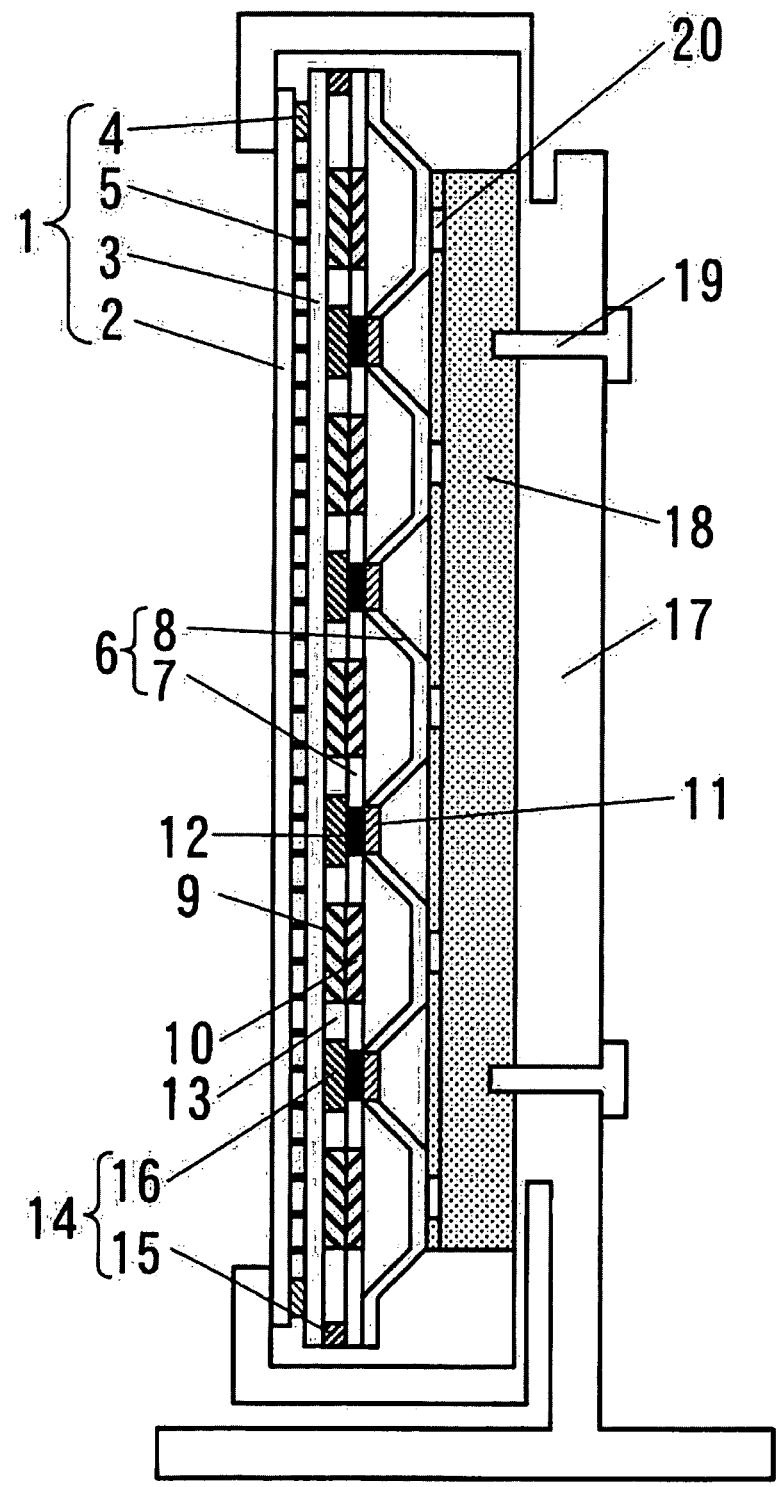
FIG. 1 is a sectional view of an image display apparatus according to a first embodiment.
Figure 2:
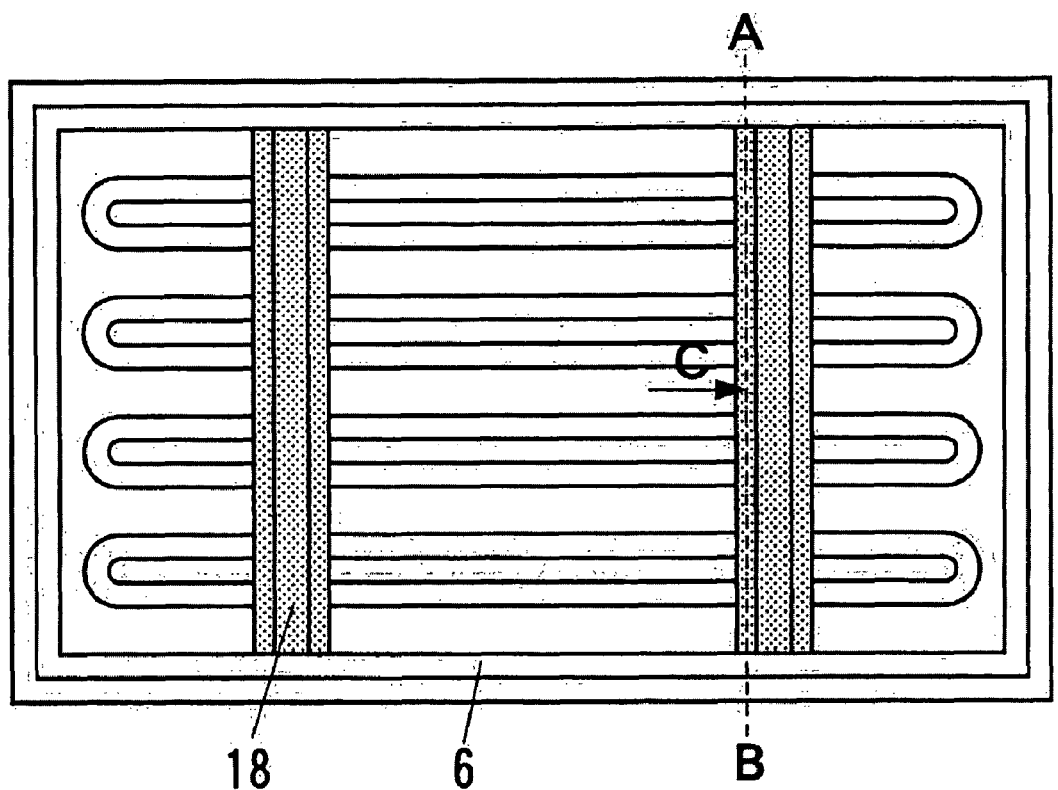
FIG. 2 is an example of the rear view showing the image display apparatus according to the first embodiment.

FIG. 1 is a sectional view of an image display apparatus according to a first embodiment of the invention. FIG. 2 shows an example of a rear view (the case 17, the fastening member 19 and the electric circuit board are not shown) of the image display apparatus according to this embodiment. FIG. 1 is a sectional view taken from side C along dashed line A-B in FIG. 2.

In FIG. 1, reference numeral 1 designates a display panel, numeral 2 a face plate, numeral 3 a rear plate, numeral 4 a frame member, and numeral 5 a spacer. The display panel 1 is configured of the face plate 2, the rear plate 3, the frame member 4 and the spacer 5. The interior of the display panel 1 is maintained in vacuum. The vacuum side (rear side) of the face plate 2 has a phosphor film (not shown) of RGB for each pixel. The vacuum side (front surface) of the rear plate 3 has an electron source (not shown) in opposed relation to the phosphor film of each of RGB. Also, the face plate 2 and the rear plate 3 are supported in parallel to each other by the spacer 5 and the frame member 4.

Numeral 6 designates a support unit, numeral 7 a first plate-like member, and numeral 8 a second plate-like member. The support unit 6 has the first plate-like member 7 and the second plate-like member 8. According to this embodiment, the support unit 6 is configured of the first plate-like member 7 and the second plate-like member 8. The support unit 6 supports the rear surface of the rear plate 3. Specifically, the support unit 6 is arranged on the atmosphere side of the rear plate 3. Also, the first plate-like member 7 and the second plate-like member 8 are arranged substantially in parallel to the rear plate 3 in spaced relation therewith.

The second plate-like member 8 has mounted thereon an electric board such as a high-voltage power supply board, a driver board and a control board not shown. These electric boards are connected electrically to the face plate 2 and the rear plate 3. Electrons are emitted from the electron source by driving the electric boards. The electrons emitted are accelerated toward and collided to the phosphor film by the high voltage applied between the face plate 2 and the rear plate 3. As a result, the phosphor film emits light and the image is displayed on the display panel 1.

Incidentally, the display panel 1 shown in FIG. 1 is an example of the display panel of the display apparatus using the electron-emitting device (cold-cathode device), to which the type of the display panel is not limited. The display panel 1 may be the one used with, for example, the plasma display, the liquid crystal display or the EL display. The display panel 1 may be a flat thin display panel of any type. The electron-emitting device is, for example, the surface conduction-type electron-emitting device, the field emission-type electron-emitting device or the MIM-type electron-emitting device.

Figure 3:
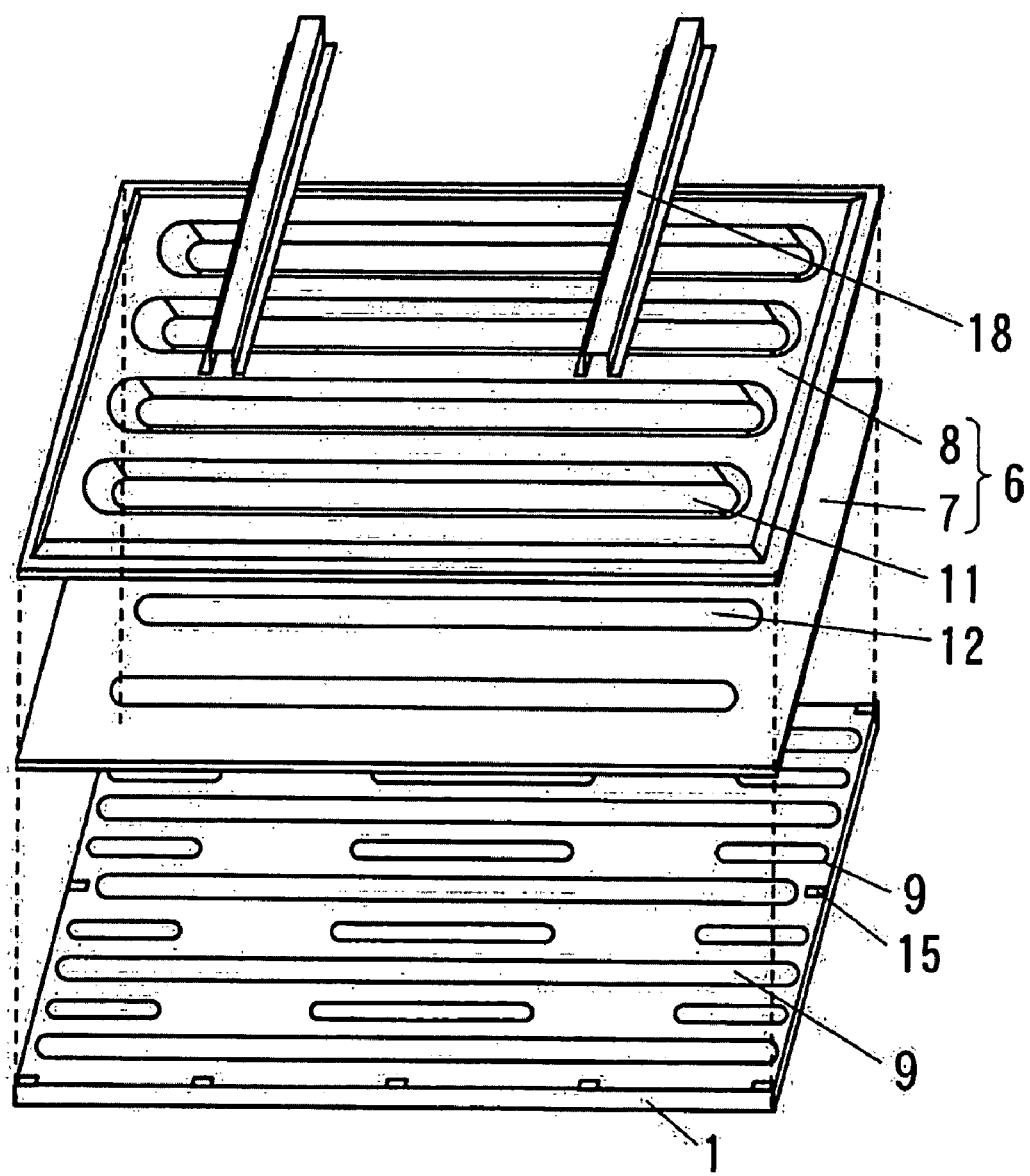
FIG. 3 is an example of the exploded perspective view showing the image display apparatus according to the first embodiment.

FIG. 3 is an example of an exploded perspective view of the image display apparatus according to this embodiment. In FIG. 3, the electric board, the heat conduction member 16, the case 17 and the fastening members 19 are not shown. The first plate-like member 7 and the second plate-like member 8 are formed of a metal material such as iron, aluminum, magnesium or an alloy thereof, a carbon material or a resin material formed in press or mold.

In FIG. 1, numeral 9 designates bonding members. The first plate-like member 7 is fixed to the display panel 1 at a first fixing area 10. Specifically, the first plate-like member 7 is fixed to the surface on the atmosphere (rear surface) side of the rear plate 3 through the bonding members 9. The bonding members 9 are each formed of a silicon adhesive or a two-side tape. The silicon adhesive is desirably used to fix the first plate-like member 7 and the display panel 1 to each other positively. Specifically, the silicon adhesive is sufficiently small in viscosity before hardening, and therefore, can well absorb the warping of the first plate-like member 7 caused by the press work, etc. As a result, the first plate-like member 7 and the display panel 1 can be positively fixed to each other. As shown in FIG. 1, the first fixing area 10 is an area of a part of the first plate-like member 7 (or the display panel 1).

Alternatively, plural first fixing areas 10 may be arranged.

The second plate-like member 8 is in such a shape as to be protruded toward the first plate-like member 7 (as protrusions). The protrusions may be formed each in the shape protruded from the base surface of the second plate-like member 8. Each protrusion is configured of flat or curved surfaces or a combination thereof. Numeral 11 designates a forward end area of each protruded portion of the second plate-like member 8. The second plate-like member 8 (each protruded portion) is fixed on the first plate-like member 7 at the second fixing areas 12. Specifically, the second plate-like member 8 is partially fixed on the first plate-like member 7 by TOX caulking, welding, bonding, etc. Thus, the second fixing areas 12 are an area of a part of the second plate-like member 8 (or the first plate-like member 7). According to this embodiment, each of the protruded forward end areas 11 (partially or wholly) is fixed to the first plate-like member 7. Incidentally, single or plural second fixing areas 12 may be arranged. Also, in the production process of the support unit 6, a metal plate is desirably formed into the protruded portions by reduction and fixed by TOX caulking.

In FIG. 1, interval defining members 15 and heat conduction members 16 are interposed, in addition to the bonding members 9, between the display panel 1 and the first plate-like member 7. According to this embodiment, the interval defining members 15 and heat conduction members 16 are formed of a material lower in rigidity (smaller in modulus of longitudinal elasticity) than the bonding members 9 in hardened state. Therefore, these members are referred to as flexible members 14. Gaps 13 are formed between these members (the bonding members 9, the interval defining members 15 and the heat conduction members 16). Incidentally, the gaps 13 and the flexible members 14 are formed in the areas other than the first fixing areas 10. Specifically, the gaps 13 and the flexible members 14 are arranged in the areas other than the first fixing areas 10 in a view projected on the surface parallel to the display surface of the display panel 1. The relative positions of the areas explained below are assumed to indicate those in a view projected on the surface parallel to the display surface of the display panel 1. The interval defining members 15 are formed of, for example, the two-side tape or the one-side tape. The interval defining members 15 are arranged to define a predetermined interval between the first plate-like member 7 and the rear plate 3. The heat conduction members 16 may be done without. The heat conduction members 16 are arranged, as required, to conduct the heat generated in the display panel 1 to the support unit 6. Incidentally, the heat conduction members 16 may be arranged at other than the positions shown in FIG. 1.

In FIG. 1, numeral 17 designates a case, numeral 18 a support member, and numeral 19 fastening members. The case 17 and the support member 18 are fastened to each other by the fastening members 19. According to this embodiment, the combination of the case 17, the support member 18 and the fastening members 19 is referred to as the exterior member. The second plate-like member 8 is fixed to the exterior member at the third fixing areas 20. Specifically, the second plate-like member 8 is fixed to the support member 18 at the third fixing areas 20. The third fixing areas 20 are an area a part of the second plate-like member 8 (or the support member 18). The third fixing areas 20 may be either single or plural. Also, the support member 18 may be a sheet metal or a spacer. The support member 18 is desirably a sheet metal fabricated by bending or otherwise processing a metal plate. The rigidity of the support unit 6 can be further increased by using the sheet metal fabricated by bending or otherwise processing as the support member 18.

Figure 4:
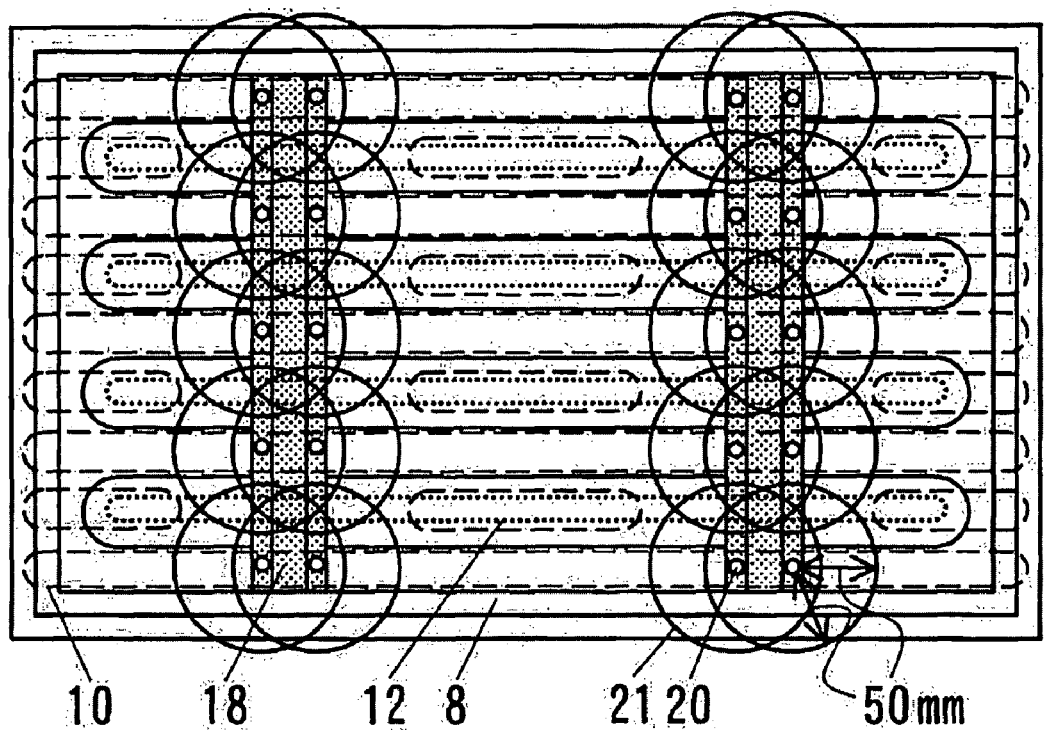
FIG. 4 is a plan view showing the relative positions of the first fixing areas and the second fixing areas of the image display apparatus according to the first embodiment.

FIG. 4 is a plan view showing the relative positions of the first fixing areas 10 and the second fixing areas 12 in the image display apparatus according to the first embodiment. The case 17, the fastening members 19 and the electric board are not shown. In FIG. 4, numeral 21 designates an area in the neighborhood of the support unit 6 (hereinafter referred to the near-support unit area), where the distance from the third fixing areas 20 is not longer than 50 mm in the direction parallel to the display panel 1 (i.e. the third fixing areas 20 assumed to be expanded by 50 mm in the direction parallel to the display panel 1). The greatest feature of this embodiment is that in the case where the first to third fixing areas are projected on the surface parallel to the display surface of the display panel 1, the first fixing areas 10 and the second fixing areas 12 are arranged in a manner not overlapped with each other in the near-support unit area 21. Incidentally, the first fixing areas 10 and the second fixing areas 12 may be arranged either in a spaced relation to each other or in such a manner that the contours of the first fixing areas 10 and the second fixing areas 12 are in contact with each other.

The stress measurement and the breaking strength measurement by the drop impact test has confirmed that the breakage of the display panel of the display apparatus according to the first embodiment can be suppressed against an external impact on the case 17.

Figure 5:
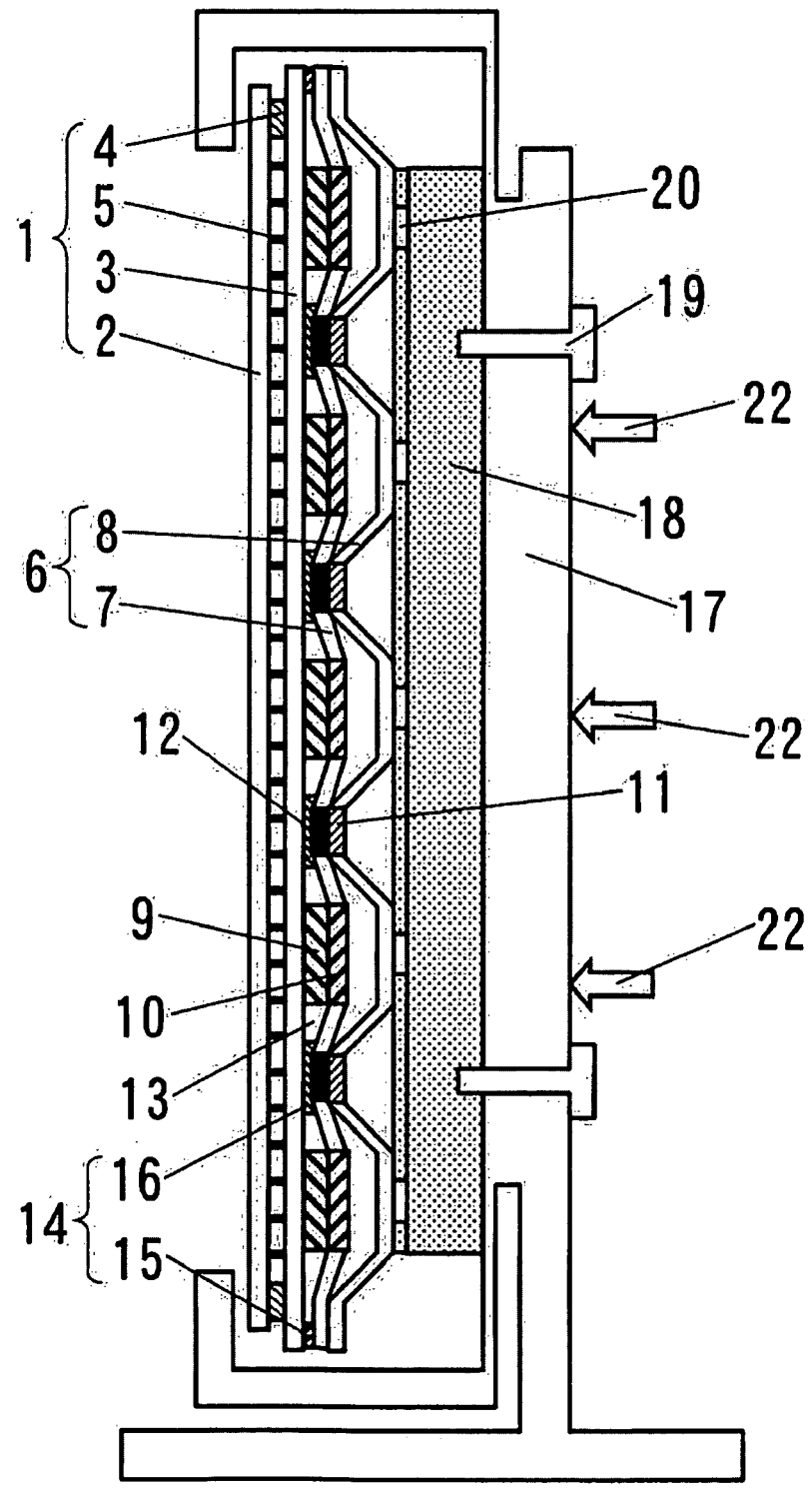
FIG. 5 is a schematic diagram showing the reason why the effect of the invention is achieved by the image display apparatus according to the first embodiment.

FIG. 5 is a schematic diagram showing the reason why the effects of the invention are achieved in the image display apparatus according to the first embodiment.

In FIG. 5, numeral 22 designates the impact. In the case where the impact 22 is made on the case 17 from an external source, the impact acceleration is transmitted to the second plate-like member 8 through the third fixing areas 20 from the support member 18. The impact acceleration transmitted to the second plate-like member 8 is transmitted further to the first plate-like member 7 through the second fixing areas 12. As a result, the first plate-like member 7 is locally deformed greatly at the second fixing areas 12. In the process, if the first fixing areas 10 and the second fixing areas 12 are in overlapped relation with each other, the local deformation of the first plate-like member 7 at the second fixing areas 12 would be transmitted to the display panel 1, so that a large stress would be developed in the display panel 1. According to this embodiment, however, the first fixing areas 10 and the second fixing areas 12 are arranged not to be overlapped one on the other in the near-support unit areas 21, and therefore, the stress generated in the display panel 1 can be reduced. Incidentally, in the case where the flexible members 14 are arranged in the second fixing areas 12, the modulus of longitudinal elasticity of the flexible members 14 is desirably sufficiently smaller than that after the hardening of the bonding members 9.

As described above, according to this embodiment, the support unit has two plate-like members, and the first fixing areas 10 and the second fixing areas 12 are arranged not in overlapped relation with each other within the near-support unit areas. As a result, an image display apparatus can be provided in which the rigidity of the support unit is high and the impact resistance of the display panel is improved.

Incidentally, the near-support unit areas 21 may not be 50 mm or less distant from the third fixing areas 20 in the direction parallel to the display panel 1. The local deformation of the second fixing areas 10 is very large in the third fixing areas 20. As long as the first fixing areas 10 and the second fixing areas 12 are arranged not in overlapped relation with each other at least within the third fixing areas 20, therefore, the impact resistance of the display panel 1 can be improved. The simulation conducted by the inventor shows that a sufficient resistance against an external impact on the case of the image display apparatus can be secured desirably in the case where the first fixing areas 10 and the second fixing areas 12 are arranged not in overlapped relation with each other within the area 50 mm or less distant from the third fixing areas 20.

Second Embodiment

Figure 6:
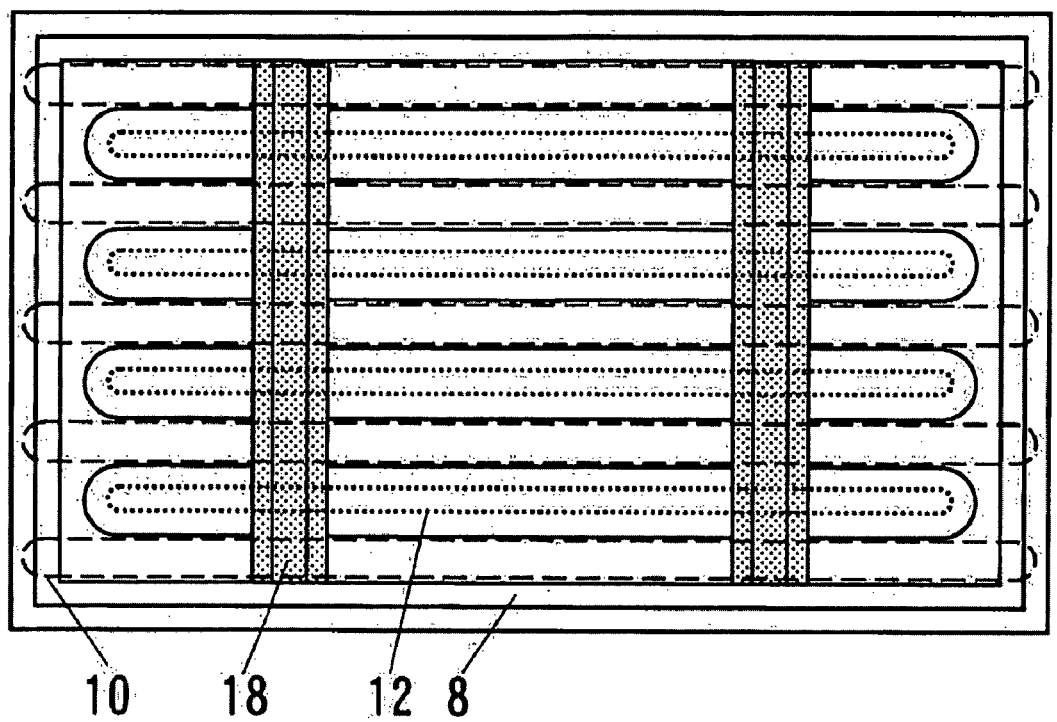
FIG. 6 is a plan view showing the relative positions of the first fixing areas and the second fixing areas of the image display apparatus according to a second embodiment.

FIG. 6 is a plan view showing the relative positions of the first fixing areas 10 and the second fixing areas 12 in the image display apparatus according to a second embodiment of the invention.

As described above, in the image display apparatus according to the first embodiment, the first fixing areas 10 and the second fixing areas 12 are arranged not in overlapped relation with each other within the area at least 50 mm or less distant from the third fixing areas 20. In the image display apparatus according to the second embodiment, on the other hand, the first fixing areas 10 and the second fixing areas 12 are arranged in positions not overlapped one on the other over the whole area of the display panel 1 in the case where the first fixing areas 10, the second fixing areas 12 and the third fixing areas 20 are projected on the surface parallel to the display surface of the display panel 1. The remaining component parts of the configuration are identical with those of the first embodiment.

The inventor has also confirmed, by measuring the breaking strength of the display panel, that the image display apparatus according to the second embodiment can suppress the breakage of the display panel due to an impact, if made thereon, from an external source. The breaking strength is measured by causing an object to collide the display panel.

Figure 7:
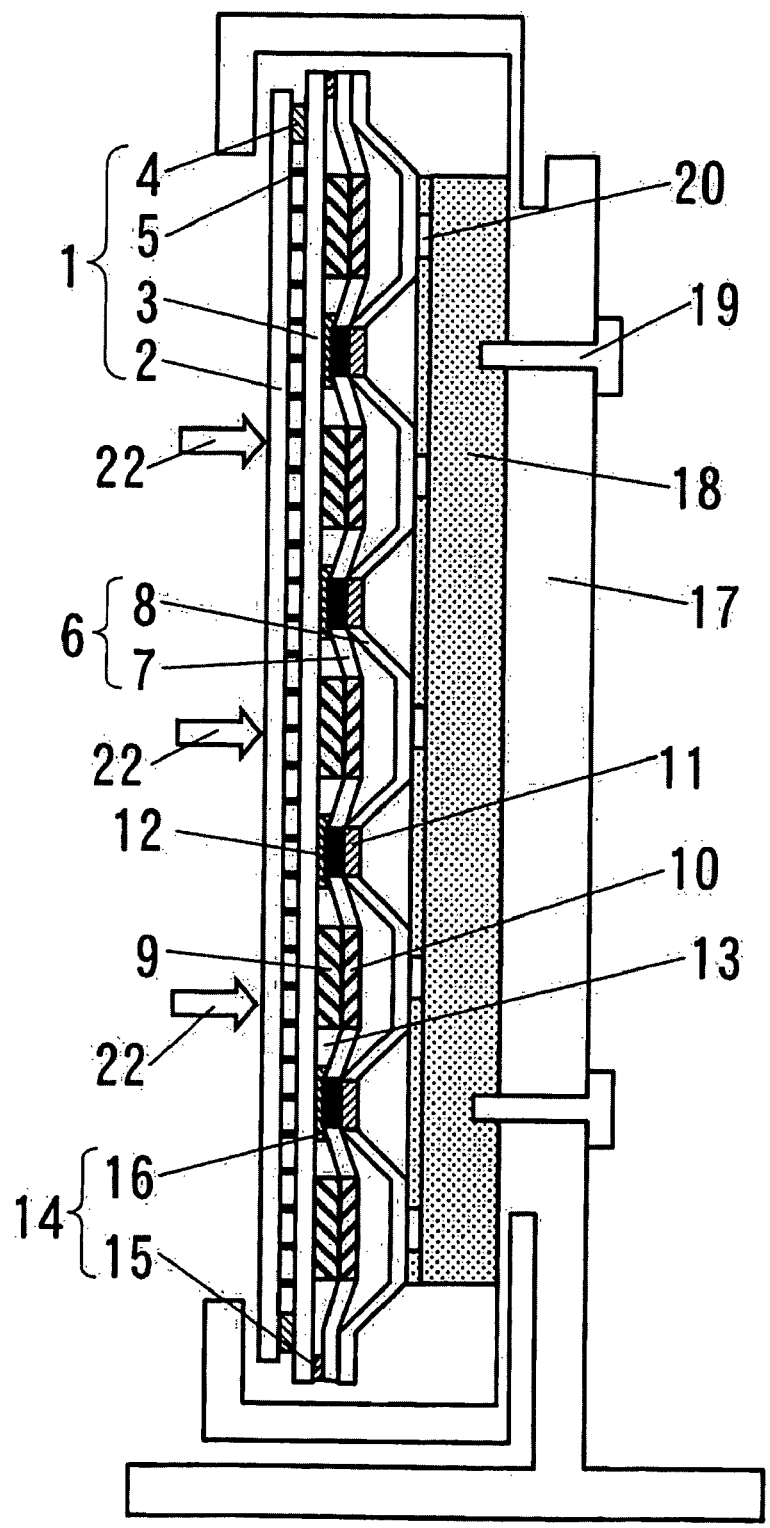
FIG. 7 is a schematic diagram showing the reason why the effect of the invention is achieved by the image display apparatus according to the second embodiment.

FIG. 7 is a schematic diagram showing the reason why the effect of the invention is achieved in the image display apparatus according to the second embodiment.

As shown in FIG. 7, in the case where impacts 22 are directly exerted on the display panel 1 from an external source, the first plate-like member 7 is locally deformed at the first fixing areas 10. The resulting protracted action of the impact reduces the impact force. In this way, the possibility of the display panel being broken is reduced.

The image display apparatus according to this embodiment includes not only the bonding members 9 but also plural members of different rigidity such as the interval defining member 15 and the heat conduction members 16 between the display panel 1 and the first plate-like member 7. Generally, the bonding members 9 have the highest rigidity of all the members interposed between the display panel 1 and the first plate-like member 7. Therefore, this embodiment is so configured that the first fixing areas 10 and the second fixing areas 12 are not overlapped one on the other. This configuration can generally suppress the breakage of the display apparatus by the impact which may be made on the display panel from an external source. In the case where a member other than the bonding member 9 has the highest rigidity among the members interposed between the display panel 1 and the second plate-like member 8, on the other hand, the particular member having the highest rigidity and the second fixing areas 12 are arranged not in overlapped relation with each other. By doing so, the support unit can have a high rigidity and the impact resistance of the display panel can be improved.

As described above, according to this embodiment, the support unit has two plate-like members and the first and second fixing areas are arranged not in overlapped relation with each other over the entire display panel. As a result, an image display apparatus is provided which has a support unit high in rigidity and a display panel improved in impact resistance.

In all the accompanying drawings, the spacer 5 and the protruded portions of the second plate-like member 8 are shown as a model to facilitate the explanation. The number and shape of the members shown in the drawings, therefore, may be different from an actual case. This is also true with the other members.

In the two embodiments described above, the protruded portions are fixed on the first plate-like member by welding or the like method. Nevertheless, any other fixing means such as screw or thread can be employed which can fix the protruded portions on the first plate-like member. This is also the case with the other fixing areas (first and third fixing areas).

In the two embodiments described above, the second plate-like member has the protruded portions. Nevertheless, the protruded portions of the second plate-like member may be done without. Even in the absence of the protruded portions of the second plate-like member, an external force is transmitted through the fixing areas (first to third fixing areas:), and therefore, the impact resistance of the display panel is improved.

While the present invention has described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-054748 filed on Mar. 5, 2008, which is hereby incorporated by reference herein in their entirety.

What is claimed is:

1. An image display apparatus comprising:
   a display panel that displays an image;
   a support unit that supports a rear surface of the display panel; and
   an exterior member that covers the support unit,
   wherein the support unit includes a first plate-like member and a second plate-like member having a concave-convex shape,
   wherein the first plate-like member is fixed to the display panel at a plurality of first fixing portions with bonding members,
   wherein convex portions of the second plate-like member are fixed to the first plate-like member at a plurality of second fixing portions,
   wherein concave portions of the second plate-like member are fixed to a support member at a plurality of third fixing portions,
   wherein the support member is fixed to the exterior member, and
   wherein the second fixing portions are arranged to not overlap with the first fixing portions at least within areas of a predetermined range from the third fixing portions in a view projected on a surface parallel to a display surface of the display panel.

2. An image display apparatus according to claim 1, wherein the second fixing portions are arranged to not overlap with the first fixing portions within areas of 50 mm from the third fixing portions in a view projected on a surface parallel to the display surface of the display panel.

3. An image display apparatus according to claim 1, wherein the second fixing portions are arranged to not overlap with the first fixing portions over the entire display panel in a view projected on a surface parallel to the display surface of the display panel.

4. An image display apparatus according to claim 1, wherein
   a plurality of heat conduction members are interposed between the display panel and the first plate-like member at the second fixing portions, and
   wherein the heat conduction members are formed of material lower in rigidity than the bonding members in a hardened state.

5. An image display apparatus, comprising:
   a display panel that displays an image, the display panel having a planar surface;
   a support unit that supports a rear surface of the display panel; and
   an exterior member that covers the support unit,
   wherein the support unit includes a first plate-like member and a second plate-like member having a concave-convex shape,
   wherein the first plate-like member is fixed to the display panel at a plurality of first fixing portions with bonding members,
   wherein convex portions of the second plate-like member are fixed to the first plate-like member at a plurality of second fixing portions,
   wherein concave portions of the second plate-like member are fixed to a support member at a plurality of third fixing portions, with at least one of the third fixing portions disposed between two of the second fixing portions,
   wherein the support member is fixed to the exterior member, and
   wherein the second fixing portions are arranged to not overlap with the first fixing portions in a direction substantially perpendicular to the planar surface.

6. An image display apparatus according to claim 5, wherein the second fixing portions are arranged to not overlap with the first fixing portions within areas of 50 mm from the third fixing portions in the direction substantially perpendicular to the planar surface.

7. An image display apparatus according to claim 5, wherein the second fixing portions are arranged to not overlap with the first fixing portions over the entire display panel in the direction substantially perpendicular to the planar surface.

8. An image display apparatus according to claim 5, wherein
   a plurality of heat conduction members are interposed between the display panel and the first plate-like member at the second fixing portions; and
   wherein the heat conduction members are formed of material lower in rigidity than the bonding members in a hardened state.

* * * * *